United States Patent [19]

Pfennings et al.

[11] Patent Number: 4,931,667
[45] Date of Patent: Jun. 5, 1990

[54] CIRCUIT ARRANGEMENT FOR A DUAL BUS LINE

[75] Inventors: Leonardus C. M. G. Pfennings; Peter H. Voss; Cormac M. O'Connell; Cathal G. Phelan; Thomas J. Davies; Hans Ontrop, all of Eindhoven, Netherlands

[73] Assignee: U.S. Philips Corporation, New York, N.Y.

[21] Appl. No.: 266,172

[22] Filed: Nov. 2, 1988

[30] Foreign Application Priority Data

Nov. 21, 1987 [DE] Fed. Rep. of Germany ..... 37394673

[51] Int. Cl.$^5$ ................. H03K 17/16; H03K 17/687
[52] U.S. Cl. ................. 307/443; 307/296.4; 307/572; 307/548
[58] Field of Search ................. 307/475, 296.4, 443, 307/572, 497, 530, 303, 303.1, 546, 548, 549, 550, 552; 365/228

[56] References Cited

U.S. PATENT DOCUMENTS

| | | | |
|---|---|---|---|
| 4,375,039 | 2/1983 | Yamauchi | 307/475 |
| 4,504,748 | 3/1985 | Oritani | 307/530 |
| 4,583,203 | 4/1986 | Monk | 307/475 |
| 4,621,202 | 11/1986 | Pumo | 307/572 |
| 4,647,797 | 3/1987 | Sanwo et al. | 307/572 |
| 4,686,396 | 8/1987 | Law et al. | 307/571 |
| 4,757,215 | 7/1988 | Seo | 307/443 |
| 4,766,334 | 8/1988 | Warner | 307/572 |

FOREIGN PATENT DOCUMENTS 0050484 4/1982 European Pat. Off. .

Primary Examiner—Stanley D. Miller
Assistant Examiner—Richard Roseen
Attorney, Agent, or Firm—Michael E. Marion

[57] ABSTRACT

Data are frequently transmitted via a dual bus line by means of differential signals which are evaluated by a differential amplifier, particularly for reasons of protection against interference. However, such a differential amplifier only has a limited input voltage range, or a dead voltage range of the input signals within which it is not capable of operating. To prevent the voltages on both bus lines from getting into this dead voltage range, either due to a common-mode interference signal on the bus lines or due to a voltage dip in the feed voltage of the differential amplifier, the two bus lines are connected in accordance with the invention to an adjusting circuit which changes the voltages of both bus lines by the same amount in the direction out of the dead voltage range. This prevents unspecified conditions of the differential amplifier without significantly influencing the differential signal on the two bus lines. The application for an integrated memory is described.

10 Claims, 4 Drawing Sheets

CIRCUIT ARRANGEMENT FOR A DUAL BUS LINE

BACKGROUND OF THE INVENTION

The invention relates to a circuit arrangement for dual bus line for the transmission of differential signal voltages, each individual bus line of which is connected to a different input of a differential amplifier which is connected to a first pole and to a second pole of a feed voltage and the operating capability of which is restricted if the voltages at the two inputs are within a dead voltage range which is limited by the voltage at one pole of the feed voltage and by a voltage between the two poles.

Dual bus lines for transmitting differential signal voltages are generally known and are used for increasing the protection of the signal voltage transmission against interference because an interference signal acting on both bus lines generally changes the signal voltages on both bus lines essentially in the same direction and by the same amount so that the difference between the signal voltages on both bus lines is essentially retained and the information transmitted by this means is not disturbed. In some cases, however, the interference signals acting on such a dual bus line can be of such a magnitude that the voltages at both inputs of the differential amplifier connected to the dual bus line fall into the dead voltage range within which the differential amplifier no longer operates properly. The same effect can also occur if, due to an interference pulse on the feed voltage of the differential amplifier, its dead voltage range, compared with the signal voltages on the dual bus line, shifts to such an extent that these two fall into the dead voltage range. As a result, the differential amplifier can produce wrong output signals or its speed of response to changes in the signal voltages on the dual bus line can be impaired.

SUMMARY OF THE INVENTION

It is therefore the object of the invention to specify a circuit arrangement by means of which the signal voltages on the dual bus line are largely prevented from falling into the dead voltage range of the differential amplifier due to interference signals.

According to the invention, this object is achieved by the fact that an adjusting circuit is provided which is connected to both bus lines and contains (a) detector means for generating a control signal at a control output if the voltages on both bus lines are simultaneously within the dead voltage range, and (b) a driver circuit which is connected to both bus lines and responds to the control signal in order to change the voltages on both bus lines by essentially the same amount in the direction of the voltage at the other pole until the voltage on at one least bus line is outside the dead voltage range.

Thus, the adjusting circuit according to the invention has the effect that, in the case of an interference signal, the signal voltages on both bus lines are essentially changed in parallel to such an extent that at least one of the signal voltages is taken out of the dead voltage range. This does not significantly affect the information contained in the difference of the signal voltages on both bus lines so that the differential amplifier always outputs an output signal corresponding to this difference between the signal voltages.

The circuit arrangement according to the invention can be used in the case of dual bus lines which are constructed, for example, as twisted cables and connect various devices or equipment sections with one another. However, a dual bus line for transmitting differential signal voltages can also be present in an integrated circuit. The invention therefore also relates to an integrated circuit for processing digital data, particularly to an integrated memory arrangement, having the circuit arrangement according to the invention and is characterized by the fact that the dual bus line is a data line which extends over a significant physical distance within the integrated circuit arrangement to a read amplifier which represents the differential amplifier, the voltage on both individual bus lines being temporarily brought to at least a value in the immediate vicinity of one limit of the dead voltage range via a precharge circuit, the detector means and the driver circuit being arranged in the physical vicinity of the read amplifier.

In an integrated memory arrangement for storing a very large number of data or bits, long conductor tracks can occur via which the signals read out of the memory cells are transmitted to a read amplifier, these signals read out frequently having a much lower amplitude than the digital signals which are received and output by the integrated circuit. Furthermore, the signal sources for the read signals, that is the memory cells themselves or read signals derived from these via preamplifiers, are generally of relatively high impedance so that a relatively large level change takes place relatively slowly while a small change in the difference, which is already sufficient for driving the differential amplifier connected to the dual bus line, can occur relatively quickly. In this connection, the precharge circuit is used for bringing the mean level of both bus lines approximately within the voltage range of the optimum behaviour of the differential amplifier which is frequently in the vicinity of the dead voltage range, but this precharge circuit is frequently of such a construction that it cannot prevent the voltages on both bus lines from falling into the dead voltage range of the differential amplifier, particularly due to interference signals. This is prevented by the circuit arrangement according to the invention.

Integrated circuit arrangements are frequently constructed in MOS technology. For this purpose, a further development of the invention is characterized by the fact that the detector means comprise two first enhancement-type MOS transistors which are connected in parallel between one pole of the feed voltage and the control output and the gates of which are connected to the bus lines, the control output being connected to the other pole of the feed voltage via a resistor arrangement, and that the driver circuit exhibits two second enhancement-type MOS transistors of the opposite type of conductivity to the first transistors, which are in each case arranged between one bus line and the other pole of the feed voltage and the gates of which are controlled by the control signal via an MOS inverter circuit.

Further developments of the invention are characterized in the remaining subclaims.

BRIEF DESCRIPTION OF THE DRAWINGS

In the text which follows, illustrative embodiments of the invention are explained in greater detail with reference to the drawings, in which.

DETAILED DESCRIPTION OF THE INVENTION

Figure 1:
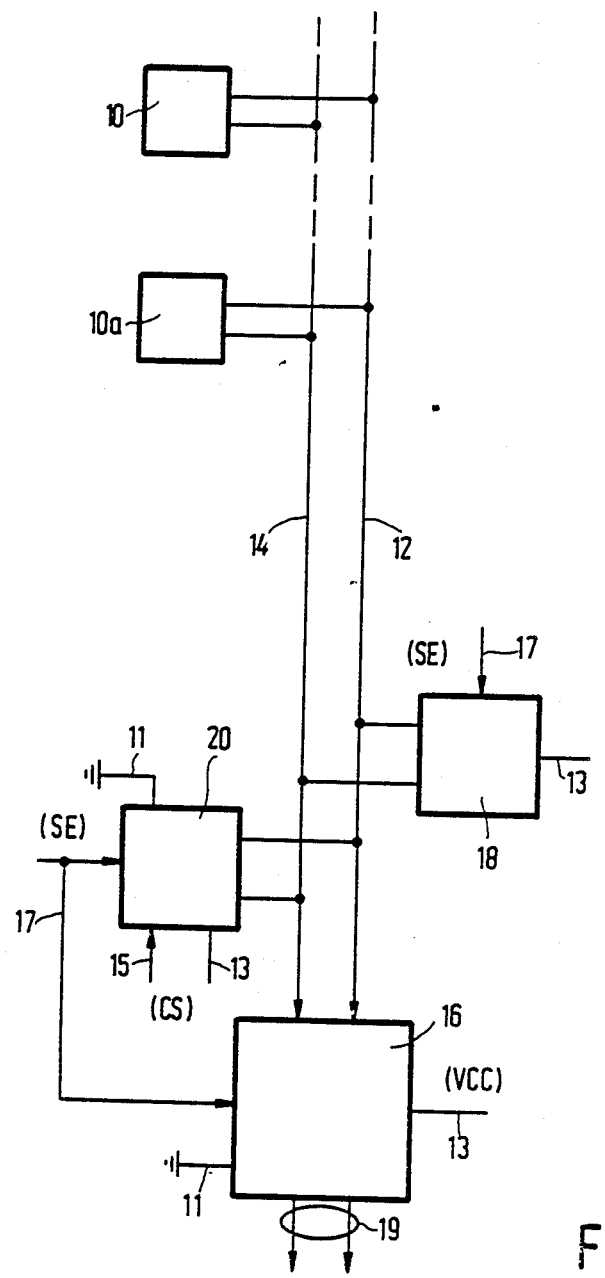
FIG. 1 diagrammatically shows as a block diagram a dual bus line according to the circuit arrangement according to the invention.

In FIG. 1, a section relating to the data transmission of an integrated memory is shown. The two bus lines 12 and 14 form a dual bus line which connects a number of read preamplifiers, of which only the amplifiers 10 and 10a are indicated as examples, to a differential amplifier 16 which emits at its output 19 complementary output signals which control, for example, an output amplifier, not shown. One of the read preamplifiers 10, 10a is in each case switched to active mode by a selection signal, not shown.

The bus lines 12 and 14 are connected to a precharge circuit 18 which brings the voltages on the two bus lines 12 and 14 to a voltage level which is within the input voltage range of the differential amplifier 16 for optimum operation. If the differential amplifier 16 contains a transistor pair as input stage, for example enhancement-type MOS transistors of p-type conduction which are connected to the positive pole of a feed voltage 13, the gate voltages of the transistors must be slightly more negative than the feed voltage so that the transistors are sufficiently conductive but not too negative in order to maintain the maximum dynamic range of the transistors. The precharge circuit 18 then brings the voltages on the bus lines 12 and 14 to a value which is within the optimum input voltage range of the differential amplifier 16, described above, as long as a signal SE at a control input 17 of the precharge circuit 18 has a high level. Furthermore, a switch, not shown, between the bus lines 12 and 14 matches their voltages to one another during this time but this is of no further significance for the invention.

The precharge circuit 18 is then constructed in such a manner that the voltages on the bus lines 12 and 14 maintain a minimum value during the high signal SE, but the voltages can also become more positive under certain circumstances so that they then leave the optimum input voltage range of the differential amplifier 16 and pass into a dead voltage range in which the transistors of the differential amplifier 16, which have been postulated as an example, are both cut off. In this case no correct complementary signals are then output at the output 19. If a voltage difference between the voltages on bus lines 12 and 14 is generated by a selected preamplifier 10 or 10a, the precharge circuit 18 then being switched off by a low signal SE, the voltage on one of the bus lines comes back into the optimum input voltage range of the differential amplifier 16, but this process takes place slowly since the amplifiers 10, 10a have high impedances and cannot recharge the unavoidable capacitances on the bus lines 12 and 14 as quickly as may be required so that a delay occurs in the signal evaluation.

In order to prevent this, an adjusting circuit 20 is provided which is also connected to both bus lines 12 and 14 and which is connected to the two poles 11 and 13 of the feed voltage like the differential amplifier 16. Furthermore, the adjusting circuit 20, like the precharge circuit 18, is controlled by the signal SE on the line 17, the differential amplifier 16, incidentally, also being controlled by this signal. Control is effected in such a manner that the precharge circuit 18 is switched be active and the adjusting circuit 20 and the differential amplifier 16 are switched to be inactive with a high signal SE while the precharge circuit 18 is cut off and the adjusting circuit 20 and the differential amplifier 16 are switched on with a low signal SE. The operating of the adjusting circuit 20 will be explained in greater detail with reference to the timing diagrams shown in FIG. 2, control by the signal CS via the line 15 initially being disregarded.

Figure 2A:
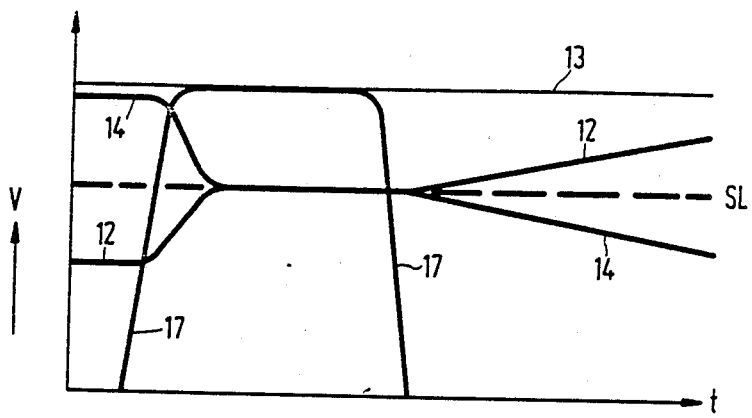
FIGS. 2a to 2c show some diagrams for the time characteristic of some voltages in the block diagram according to FIG. 1

In FIG. 2a, it is assumed that two storage locations are selected in short succession, the rising edge of the signal SE on line 17 specifying the end of the selection of one storage location and the falling edge specifying the evaluation of the information content of the storage location selected thereafter. The other signal voltage changes required in the meantime are not shown since they are not of any significance for the invention.

Before the rise of the signal on line 17, the bus lines 12 and 14 had accepted a differential signal which corresponded to the information of the storage location read out. The rise of the signal on line 17 drives the precharge circuit 18 which short circuits both bus lines by means of the previously mentioned switch, not shown, so that the voltages on both bus lines go to the optimum input voltage level of the differential amplifier 16 which is here specified by SL. It is assumed in this context that the voltages of both bus lines were balanced with respect to this level SL. If these voltages had changed in an unbalanced way and become slightly lower, they are essentially brought back to the optimum input voltage level SL by the precharge circuit. As soon as the signal on line 17 becomes low again, the voltages on the bus lines 12 and 14 can change in accordance with the information read out, due to the drive by the selected read preamplifier, which very rapidly results in an adequate voltage difference to which the differential amplifier 16 responds.

Figure 2B:
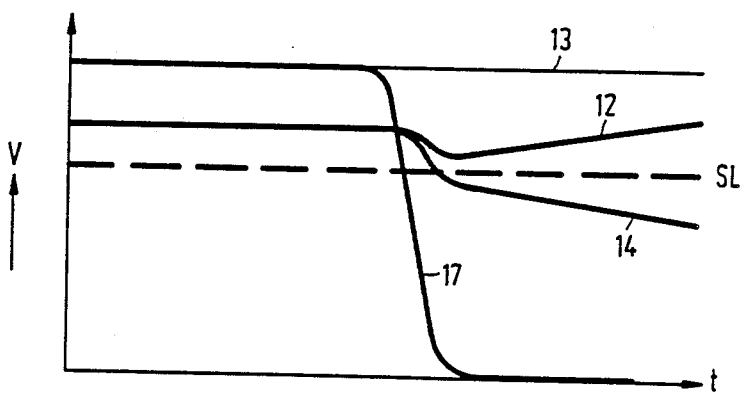

In FIG. 2b, it is then assumed that the last reading out of a storage location has taken place a relatively long time before, that is to say the signal on line 17 is high for a relatively long time and the voltages on bus lines 12 and 14 have drifted, for example due to leakage currents, into a voltage range between the optimum voltage level SL and the positive operating voltage 13 which essentially represents the dead voltage range of the differential amplifier 16 since the precharge circuit 18 only ensures that the voltages on the bus lines 12 and 14 do not become any more negative than the optimum input voltage level SL of the differential amplifier 16. If then the signal on line 17 becomes low after selection of a storage location, the adjusting circuit 20 causes the voltages on both bus lines 12 and 14 to be rapidly pulled in the direction of the voltage at pole 11 of the feed voltage, that is to say in the direction of earth, both by the same amount. FIG. 2b shows that, as a result, the voltage on bus line 14 quickly passes into the optimum input voltage range of the differential amplifier 16, the increasing differential voltage on both bus lines being generated by drive from the selected read preamplifier so that, in spite of the voltages on bus lines 12 and 14 which had previously drifted away, the differential amplifier 16 can rapidly respond after it has been switched on by the falling edge of the signal on line 17.

Figure 2C:
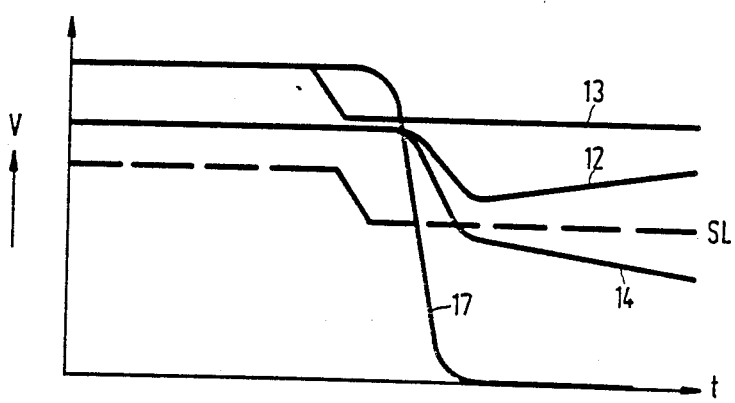

In FIG. 2c, it is assumed that the voltage at the positive pole 13 of the feed voltage suffers an at least short-time dip, for example caused by a rapid current change via the positive pole 13 of the feed voltage. In this case, the optimum input voltage level SL of the differential amplifier 16 also shifts by the same amount Since, as previously mentioned, the input stage of the differential amplifier 16 needs a minimum voltage difference from the positive feed voltage 13 at the input. The dead voltage range of the differential amplifier 16 has thus shifted by the amount of the voltage dip. If the signal on line 17 becomes low in this condition, the voltages on both bus lines 12 and 14 are also made lower by the adjusting circuit 20 until at least one of these voltages comes below the voltage level SL, that is to say the voltage on bus line 14 in the example according to FIG. 2c. After that, the voltages on both bus lines 12 and 14 then change, that is to say their difference continues to change in accordance with the drive by the corresponding preamplifier as if both bus voltages had originated from a common level according to the optimum input voltage level SL at the negative edge of the signal on line 17. Here, too, it can been seen that the differential amplifier 16 is again capable of operating correctly immediately after the negative edge of the signal on line 17.

Figure 3:
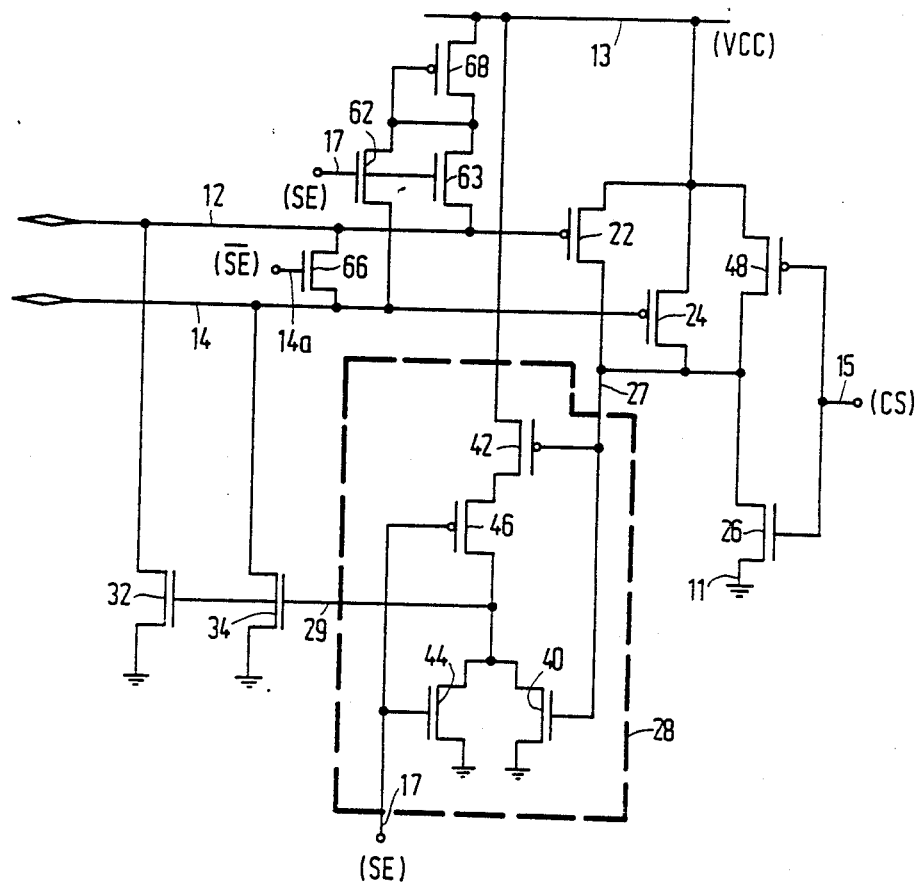
FIG. 3 shows an embodiment of the detector means and of the driver circuit with MOS transistors.

In FIG. 3, an illustrative embodiment of the adjusting circuit 20 having enhancement-type MOS transistors is shown and also includes a section of the precharge circuit 18.

The latter essentially consists of the NMOS transistors 62 and 63 which in each case connect one of the bus lines 12 and 14 via an enhancement-type PMOS transistor 68, connected as a diode, to the positive pole 13 of the feed voltage when the signal SE on line 17 is high, that is essentially has the same voltage value as the positive pole 13 of the feed voltage Furthermore, both bus lines 12 and 14 are connected by a PMOS transistor 66 which is driven by the inverse signal $\overline{SE0}$ on line 14a and is conductive when this signal is low, that is to say the signal SE is high on the line. The threshold voltages of the transistors 62, 63 and 68 are selected in such a manner that they become conductive when the voltage on the relevant bus line 12 or 14 is more negative than the optimum voltage level SL indicated in FIG. 2. However, the voltage on bus lines 12 and 14 can become higher than the optimum voltage level SL, for example due to a corresponding interference signal which is capacitively coupled in or leakage currents or a voltage dip in the positive feed voltage 13.

In order to prevent this, the adjusting circuit is provided which here essentially consists of the PMOS transistors 22 and 24 and the NMOS transistors 26, 32 and 34 and the inverter 28. Hereby, it is assumed that the signal CS on line 15 is high so that the transistor 26 is switched on. When the voltage on at least one of the bus lines 12 or 14 is sufficiently low, at least one of the transistors 22 or 24 is conductive. If the ratio between the width and the length of the channel of each of the transistors 22 and 24 is selected to be much greater than the corresponding ratio of the transistor 26, it can be achieved that the connection 27 of all three transistors carries a high signal voltage if the voltages on at least one of the bus lines 12 and 14, respectively, is essentially at the optimum voltage level SL. If both voltages are higher, the transistors 22 and 24 are cut off to such an extent that the signal on line 27 is pulled towards low in the direction of the earth pole 11 of the feed voltage by the transistor 26 so that the line 29 at the output of the inverter 28 becomes positive and switches on the two transistors 32 and 34. These transistors then connect the bus line 12 and 14, respectively, to the earth potential 11 so that the voltage on both bus lines is made lower until the voltage on at least one of the bus lines drops below the voltage level SL and makes the corresponding transistor 22 or 24 conductive to such an extent that the voltage on connection 27 goes high again.

The inverter 28 is constructed as an inverting CMOS gate which comprises the series circuit of the two PMOS transistors 42 and 46, which is connected to the positive feed voltage 13, and the parallel circuit of the two NMOS transistors 40 and 44, which is connected to earth potential 11, the junction of which NMOS transistors is connected to the output line 29 of the inverter 28. The gates of the transistors 44 and 46 are connected to line 17 which carries the signal SE. When this signal is high, the transistor 44 is conducting and the transistor 46 is cut off so that the signal on output line 29 is low and the transistors 32 and 34 are cut off, independently of the signal state on line 27. Transistor 44 is cut off and transistor 46 conducts, only when the signal SE is low, and thus the inverse signal to that on line 27 then occurs on the output line 29. This corresponds to the conditions explained with reference to FIGS. 2a to 2c.

In parallel with the transistors 22 and 24 is located a further PMOS transistor 48, the gate of which, like that of transistor 26, is connected to line 15 which carries a detector switch-off signal CS. When this signal is low, the transistor 26 is cut off and the transistor 48 conducts, as a result of which the detector is switched off which prevents a continuous current from flowing between the two poles of the feed voltage. Thus, power loss can be prevented by the low signal CS in particular phases of the selection of the integrated memory arrangement.

Figure 4:
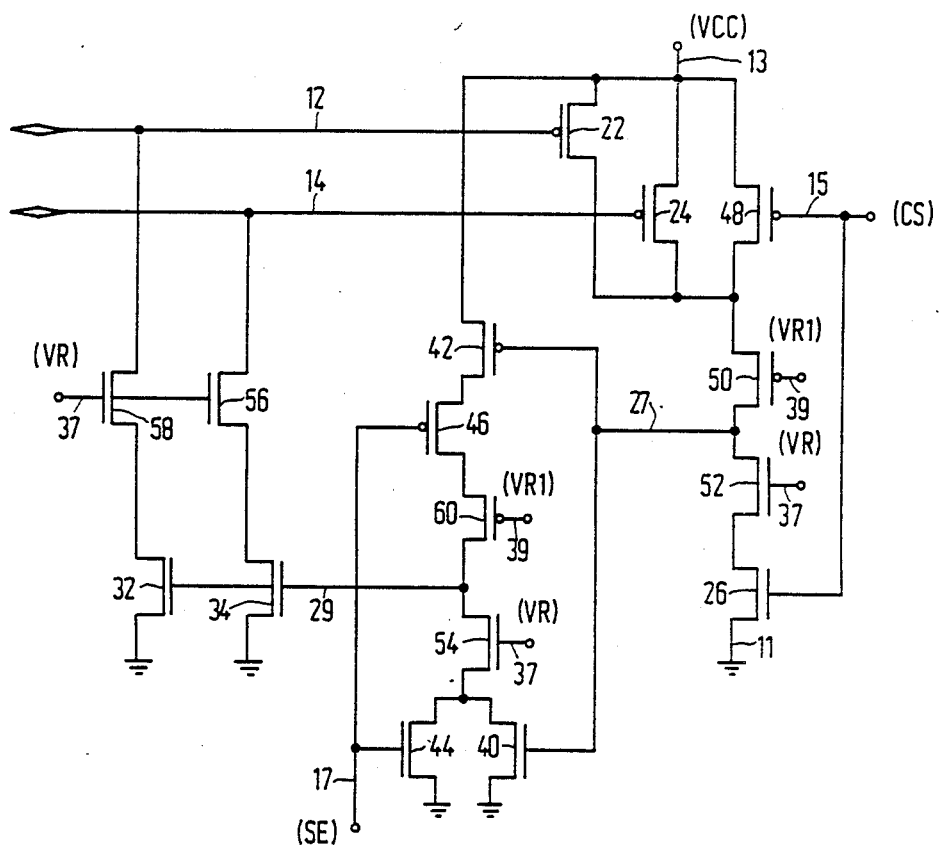
FIG. 4 shows a corresponding circuit diagram with additional transistors for preventing the creation of hot electrons.

The circuit according to FIG. 4 differs from that according to FIG. 3 in that the precharge circuit with the transistors 62, 63, 66 and 68 has been omitted and that each of NMOS transistors 52, 58, 56 and 54 respectively, have gates of which are connected to a line 37 which carries a bias voltage VR equal to a fraction of the feed voltage. Transistors 52, 58, 56 and 54 are each connected respectively in series with the transistors 26, 32 and 34 and the parallel circuit of the transistors 40 and 44. Correspondingly further PMOS transistors 50 and 60, have gates which are connected to a line 39 which carries a bias voltage VR1 equal to a fraction of the feed voltage. Transistors 50 and 60 are each respectively connected in series with the parallel circuit of transistors 22, 24 and 48 and the series circuit of the transistors 42 and 46, the two fractions being normally different. In the simplest case, VR can also be selected to be equal to VCC and VR1 can be selected to be equal to earth potential. These additional transistors prevent hot electrons from occurring in particular zones of the corresponding transistors with which they are connected in series.

It is clear that the circuit shown in FIG. 3 and FIG. 4, respectively, must be arranged in the immediate physical vicinity of differential amplifier 16 so that no significant voltage differences can occur between the connections to the poles 11 and 13 of the feed voltage of the same sign.

The illustrative embodiments of the invention explained above relate to an integrated circuit, but it is clear that the dual bus line consisting of the individual bus lines 12 and 14 can also connect various devices or equipment sections and that the adjusting circuit can also be implemented in a different manner than shown in FIG. 3 and FIG. 4, particularly also by means of discrete components.

I claim:

1. A circuit arrangement for a dual bus line for the transmission of differential signal voltages, each individual bus line of which is connected to a different input of a different amplifier which is connected to a first pole and to a second pole of a feed voltage and the operating capability of which is restricted if the voltages at the two inputs are within a dead voltage range which is limited by the voltage at one pole of the feed voltage and by a voltage between the two poles, characterized in that an adjusting circuit is provided which is connected to both bus lines and contains
   (a) detector means for generating a control signal at a control output if the voltages on both bus lines are simultaneously within the dead voltage range, and
   (b) a drive circuit, which is connected to both bus lines and responds to the control signal in order to change the voltages on both bus lines by essentially the same amount in the direction of the voltage at the other pole until the voltage on at least one bus line is outside the dead voltage range.

2. An integrated circuit arrangement for processing digital data, having a circuit arrangement according to claim 1, wherein the dual bus line is a data line which extends over a significant physical distance within the integrated circuit arrangement to said differential amplifier, the voltage on both individual bus lines being temporarily brought to at least a value in the immediate vicinity of one limit of the dead voltage range via a precharge circuit, and the detector means and the driver circuit being arranged in the physical vicinity of said differential amplifier.

3. An integrated circuit according to claim 2, wherein the detector means comprise two first enhancement-type MOS transistors which are connected in parallel between one pole of the feed voltage and the control output and the gates of which are connected to the bus lines, the control output being connected to the other pole of the feed voltage via a resistor arrangement, and that the driver circuit exhibits two second enhancement-type MOS transistors of the opposite type of conductivity to the first transistors which are in each case arranged between one bus line and the other pole of the feed voltage and the gates of which are controlled by the control signal via an MOS inverter circuit.

4. An integrated circuit according to claim 3, wherein the inverter circuit is constructed as an inverting CMOS gate having a switching input and wherein said differential amplifier switchably disables said switch input, said differential amplifier and said switching input being controlled by a common switching signal.

5. An integrated circuit according to claim 3, wherein the resistor arrangement in a third enhancement-type MOS transistor of the same type conductivity as the second transistors, with a width/length ratio which is smaller than that of the first transistors, that fourth enhancement-type MOS transistor of the same type of conductivity as the first transistors is arranged in parallel with the first transistors and the gates of the third and fourth transistor are controlled by a detector switching signal.

6. An integrated circuit according to claim 3, having such a small structure that hot electrons can occur in a plurality of first selected transistors, wherein a further transistor, a gate of which is connected to a fixed bias voltage, si connected between said first selected transistors and a plurality of second selected transistors connected to said poles of the feed voltage.

7. An integrated circuit according to claim 4, wherein the resistor arrangement is a third enhancement-type MOS transistor of the same type conductivity as the second transistors, with a width/length ratio which is smaller than that of the first transistors, that a fourth enhancement-type MOS transistor of the same type of conductivity as the first transistors is arranged in parallel with the first transistors and the gates of the third and fourth transistor are controlled by a detector switching signal.

8. An integrated circuit according to claim 4, having such a small structure that hot electrons can occur in a plurality of first selected transistors, wherein a further transistor, a gate of which is connected to a fixed bias voltage, is connected between said first selected transistors and a plurality of second selected transistors connected to said poles of the feed voltage.

9. An integrated circuit according to claim 5, having such a small structure that hot electrons can occur in a plurality of first selected transistors, wherein a further transistor, a gate of which is connected to a fixed bias voltage, is connected between said first selected transistors and a plurality of second selected transistors connected to said poles of the feed voltage.

10. The integrated circuit arrangement of claim 2, wherein said differential amplifier is a read amplifier.